«12» United States Patent
Brueck et al.

(10) Patent No.: US 9,991,684 B2
(45) Date of Patent: Jun. 5, 2018

(54) LINED-UP ELECTRICAL ENCLOSURE SYSTEM

(71) Applicant: RITTAL GMBH & CO. KG, Herborn (DE)

(72) Inventors: Daniel Brueck, Giessen (DE); Wolfgang Reuter, Liebenscheid (DE)

(73) Assignee: RITTAL GMBH & CO. KG (DE)

( * ) Notice: Subject to any disclaimer, the term of this patent is extended or adjusted under 35 U.S.C. 154(b) by 1 day.

(21) Appl. No.: 15/116,735

(22) PCT Filed: Jan. 28, 2015

(86) PCT No.: PCT/DE2015/100036
§ 371 (c)(1),
(2) Date: Aug. 4, 2016

(87) PCT Pub. No.: WO2015/117599
PCT Pub. Date: Aug. 13, 2015

(65) Prior Publication Data
US 2016/0352083 A1   Dec. 1, 2016

(30) Foreign Application Priority Data
Feb. 5, 2014  (DE) .................. 10 2014 101 401

(51) Int. Cl.
H05K 5/06 (2006.01)
H02B 1/30 (2006.01)
H05K 7/14 (2006.01)

(52) U.S. Cl.
CPC .............. H02B 1/308 (2013.01); H05K 7/14 (2013.01)

(58) Field of Classification Search
CPC ................................ H02B 1/308; H05K 7/14
(Continued)

(56) References Cited

U.S. PATENT DOCUMENTS 3,791,681 A * 2/1974 Moldow ............. F24F 13/0209
                                                  285/233
5,202,818 A * 4/1993 Betsch ................... H02B 1/301
                                                  211/189

(Continued)

FOREIGN PATENT DOCUMENTS

EP   0844708 A1   5/1998
EP   1601074 B1   4/2007

OTHER PUBLICATIONS

International Search Report (in English and German) and Written Opinion (in German) for PCT/DE2015/100036, dated Apr. 2, 2015; ISA/EP.

(Continued)

Primary Examiner — Timothy Thompson
Assistant Examiner — Rhadames J Alonzo Miller
(74) Attorney, Agent, or Firm — Harness, Dickey & Pierce, P.L.C.

(57) ABSTRACT

A switchgear cabinet system, which is assembled from switchgear cabinet units strung together in a row, each switchgear cabinet unit comprising a rack which is made up of frame profiles, in which at least the vertical frame profiles have the following features: the frame profile is mirror symmetrical with respect to a cross-sectional diagonal; the frame profile has profile sides that form the outer sides of the rack; projecting outward from the profile sides are profile projections, each extending outward from one of the profile sides; when two racks are strung together, corresponding profile projections of two frame profiles are situated mirror symmetrically opposite one another in each case, leaving a gap between the end faces of the profile projections, which is closed by a seal, characterized in that the seal is a push-on seal that is seated on at least one of the opposing profile projections.

15 Claims, 4 Drawing Sheets

Figure 1A:
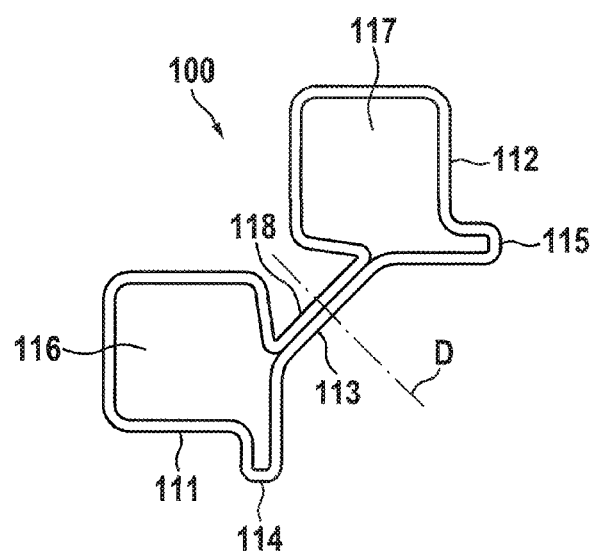

(58) Field of Classification Search
USPC .......................................................... 174/50.5
See application file for complete search history.

(56) References Cited

U.S. PATENT DOCUMENTS

| | | | | |
|---|---|---|---|---|
| 5,749,476 A * | 5/1998 | Besserer | ................ | H02B 1/301 211/182 |
| 5,930,972 A * | 8/1999 | Benner | ................... | H02B 1/01 211/189 |
| 5,992,646 A * | 11/1999 | Benner | ................... | H02B 1/01 211/26 |
| 5,997,117 A * | 12/1999 | Krietzman | ............. | H02B 1/301 312/265.4 |
| 6,120,206 A * | 9/2000 | Benner | ................. | A47B 47/03 312/265.1 |
| 6,123,400 A * | 9/2000 | Nicolai | ................. | H02B 1/301 211/189 |
| 6,138,843 A * | 10/2000 | Nicolai | ................... | H02B 1/01 211/182 |
| 6,190,081 B1 * | 2/2001 | Besserer | ................. | H02B 1/32 211/183 |
| 6,206,211 B1 * | 3/2001 | Nicolai | ................... | H02B 1/01 211/182 |
| 6,217,138 B1 * | 4/2001 | Benner | ................... | H02B 1/01 211/182 |
| 6,231,142 B1 * | 5/2001 | Pochet | .................... | H02B 1/16 211/189 |
| 6,273,533 B1 * | 8/2001 | Nicolai | .................... | H02B 1/01 211/182 |
| 8,128,183 B2 * | 3/2012 | Shen | ....................... | A47B 96/14 312/223.1 |
| 8,182,897 B2 * | 5/2012 | Shen | ....................... | H02B 1/01 312/257.1 |
| 2001/0050516 A1 * | 12/2001 | Minoura | ................ | H02B 1/308 312/223.1 |
| 2002/0121387 A1 * | 9/2002 | Suzuki | .................... | H02B 1/01 174/50 |
| 2002/0140325 A1 * | 10/2002 | Webster | ................... | H02B 1/50 312/223.1 |
| 2002/0166831 A1 * | 11/2002 | Klassen | ................. | E05D 5/023 211/183 |
| 2002/0167250 A1 * | 11/2002 | Klassen | ................ | H02B 1/301 312/265.1 |
| 2003/0172613 A1 * | 9/2003 | Fontana | ................ | H05K 7/183 52/282.1 |
| 2010/0178455 A1 * | 7/2010 | Shen | ........................ | H02B 1/01 428/134 |

OTHER PUBLICATIONS

International Preliminary Report on Patentability (Chapter II) (in German) for PCT/DE2015/100036, dated Apr. 25, 2016; IPEA/EP.

* cited by examiner

LINED-UP ELECTRICAL ENCLOSURE SYSTEM

CROSS-REFERENCE TO RELATED APPLICATIONS

This application is a 371 U. S. National Stage of International Application No. PCT/DE2015/100036, filed on Jan. 28, 2015, which claims priority to German Application No. 10 2014 101 401.4, filed on Feb. 5, 2014. The entire disclosures of the above applications are incorporated herein by reference.

FIELD

The disclosure relates to a switchgear cabinet system constructed from switchgear cabinet units that are strung together, each switchgear cabinet unit comprising a rack composed of frame profiles, in which at least the vertical frame profiles have the following features: The frame profile is mirror symmetrical with respect to a cross-sectional diagonal; the frame profile has profile sides that form the outer sides of the rack; and projecting outward from the profile sides are profile projections, each extending outward from one of the profile sides. When two racks are strung together, corresponding profile projections of two frame profiles are situated mirror symmetrically opposite one another in each case, leaving a gap between the end faces of the profile projections, which is closed by a seal.

BACKGROUND

This section provides background information related to the present disclosure which is not necessarily prior art.

For switchgear cabinets, modularity is an important criterion, as it increases the number of potential areas of application. A modular switchgear cabinet unit can be combined with other cabinet units of the same type, allowing cabinet units to be assembled according to customer requirements to form a larger switchgear cabinet system. In particular, such switchgear cabinet systems can be modularly adapted to the required or available space. Modularity also has the advantage of allowing cables and wires to be installed internally through the individual switchgear cabinet unit. Because when cabinets are strung together, the side walls are eliminated at the points of connection, a rack is required for stability. The cabinets are therefore strung together via the rack, which raises the problem of sealing the system from the exterior or the surrounding area. Seals are thus introduced at points of attachment to prevent dust or moisture, for example, from penetrating, to the greatest extent possible.

A frame profile of a rack designed for a modular switchgear cabinet unit is known from EP 1 601 074 B1. At the point of attachment between two mutually facing frame profiles, a sealing strip is inserted, which is designed to complement a sealing assembly that is produced by two outer cores of the profile that are seated flush against one another and a modular connector assembly comprising a coupling member, which is compressed by bolts. The known assembly is complex and requires multiple assembly steps.

SUMMARY

This section provides a general summary of the disclosure, and is not a comprehensive disclosure of its full scope or all of its features.

The object of the disclosure is therefore to provide a switchgear cabinet system in which the modules can preferably be strung together without tools.

According to the disclosure, it is provided that the seal is a push-on seal which is seated on at least one of the opposing profile projections of the frame profiles. No additional sealing measures are required in principle, although they may contribute to the stability of the assembly.

According to a preferred embodiment of the disclosure, it is provided that the push-on seal has at least two legs arranged opposite one another, between which a gap is formed, the width of which is less than or equal to the thickness of the profile projection of the selected frame profile. The profile projection is thus at least encompassed by a frictional fit, although if the width of the gap is smaller than the thickness of the profile projection, a suitable material selection may be used to ensure that the push-on seal is seated against the profile projection with a certain amount of intrinsic tension.

It is further preferred that the bridge that connects the mutually opposing legs of the push-on seal has a bearing surface that is wider than the thickness of the profile projection of the frame profile to be attached at that surface. This measure allows a compensation for tolerances that may occur when the switchgear cabinet rows are strung together. In this case as well, suitable material selection may be used to ensure that the profile projection of the frame profile to be attached can be inserted into the connecting bridge, so that once again a dust-tight and moisture-tight seal is produced, including in the rack to be attached. This push-on seal configuration also enables a switchgear cabinet system to be produced from different racks. In particular, the rack to be attached does not need to have a specifically designed profile projection.

It can further be provided that the opposing sides of the push-on seal are of different lengths. This makes it easier to apply the push-on seal to the profile projection of the selected frame profile.

It may also be provided that the opposing legs of the push-on seal have different widths. This also facilitates application of the push-on seal, since the material of one of the opposing legs is more resilient.

According to a preferred embodiment of the disclosure, the push-on seal is H-shaped in cross-section.

The length of the legs of the H-shaped seal may be adapted to specific circumstances, taking into account the fact that tool-free application is generally made more difficult if increased frictional force must be overcome due to the length of the legs. With certain profiles, however, it may be advantageous for the length of the legs of the H-shaped seal in the cross-sectional direction of the frame profile to correspond substantially to the lengths of the profile projections.

Once again, to facilitate the stringing together of a rack to be attached, or to facilitate the application of the push-on seal to the profile projection of said rack, it may be provided that a gap is formed between the opposite legs of the push-on seal, which widens starting from the bridge that connects them and proceeding outward.

Suitable frame profiles have profile projections, for example, that extend perpendicularly from each profile side. Other embodiments are characterized in that the profile projections extend at an angle of approximately 135° in relation to each profile strip.

Preferably, a hollow profile having at least one hollow chamber is used, which is characterized by high stability, particularly torsional rigidity.

According to a particular embodiment, two hollow chambers are provided, connected by a connecting bridge. In this embodiment, a dovetail groove which is symmetrical with respect to the cross-sectional diagonal may be formed between the two hollow chambers, bordering the connecting bridge. Alternatively, a third hollow chamber may be formed between the two hollow chambers, bordering the connecting bridge.

Single-chamber hollow profiles are rectangular or square in cross-section, for example. In one variant, the profile sides may comprise two profile side segments that merge into one another and are angled such that the first profile side segment of the first profile side extends perpendicular to the first profile side segment of the second profile side, and the second profile side segment of the first profile side extends parallel to the second profile side segment of the second profile side.

The disclosure may be used for stringing together similar racks and also for racks in which the vertical frame profiles have different profile geometries. Different profile geometries within a single rack are also possible.

It is understood that the hollow profile is provided with holes for mounting components for internal fittings for the rack or the switchgear cabinet unit. However, these are not the subject matter of the present disclosure and thus will not be detailed here.

DRAWINGS

The drawings described herein are for illustrative purposes only of selected embodiments and not all possible implementations, and are not intended to limit the scope of the present disclosure.

Figure 1B:
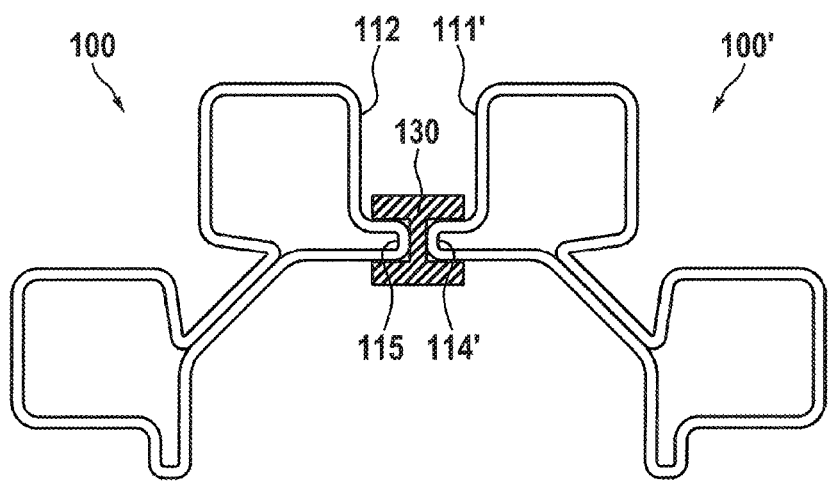
Figure 2A:
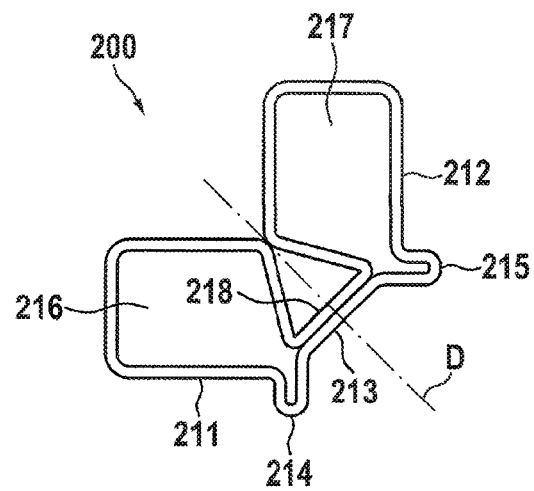
Figure 2B:
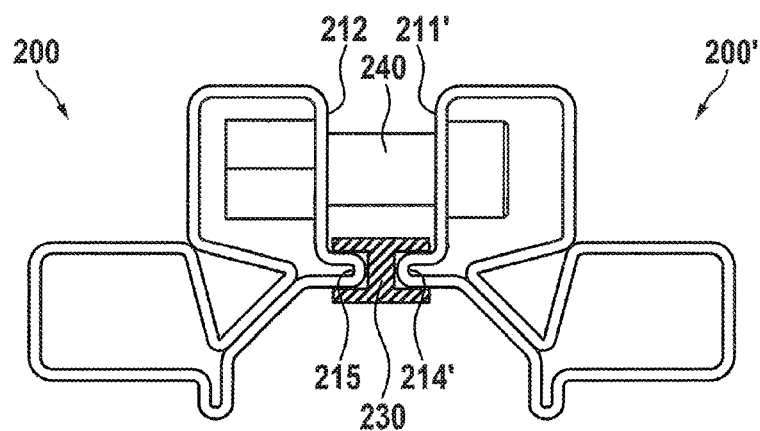
Figure 3A:
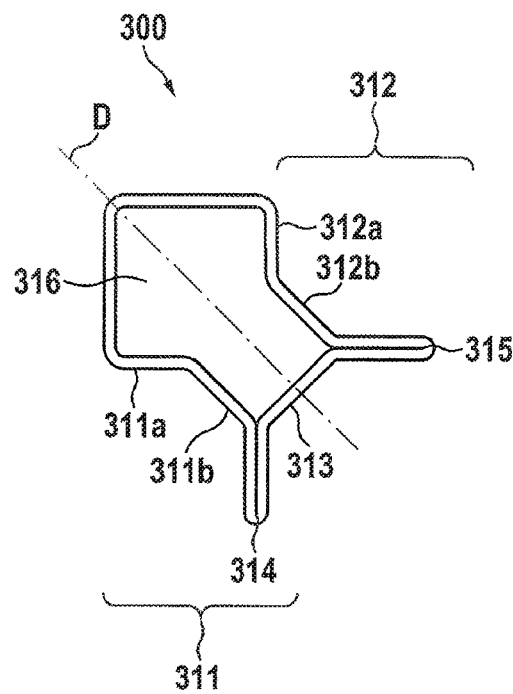
Figure 3B:
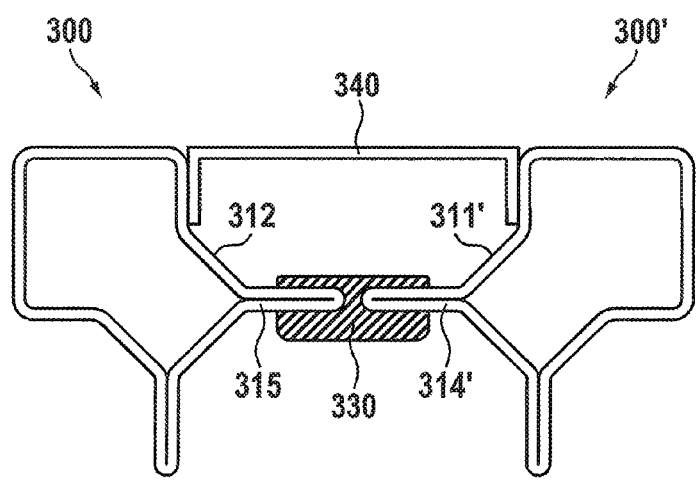
Figure 4A:
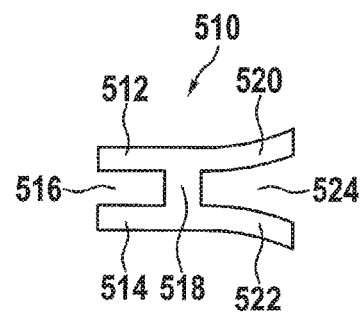
Figure 4B:
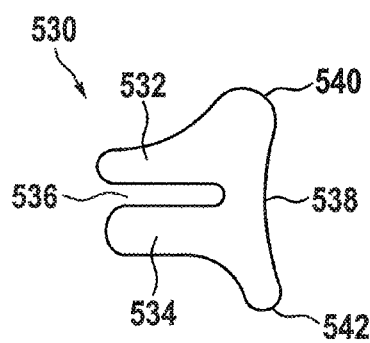
Figure 4C:
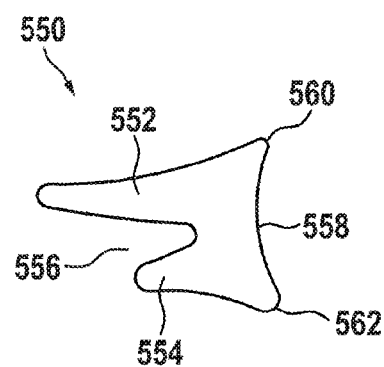

In the following, the disclosure will be described in greater detail with reference to the accompanying drawings. The cross-sectional diagrams of the profile and of the seal are not necessarily drawn to scale. The drawings show:

FIG. 1a a cross-sectional view of a first frame profile for a rack of a modular switchgear cabinet unit;

FIG. 1b a cross-sectional view of frame profiles according to FIG. 1a strung together, with a seal positioned between the frame profiles;

FIG. 2a a cross-sectional view of a second frame profile for a rack of a modular switchgear cabinet unit;

FIG. 2b a cross-sectional view of frame profiles according to FIG. 2a strung together, with a seal positioned between the frame profiles;

FIG. 3a a cross-sectional view of a third frame profile for a rack of a modular switchgear cabinet unit;

FIG. 3b a cross-sectional view of frame profiles according to FIG. 3a strung together, with a seal positioned between the frame profiles;

FIG. 4a a cross-sectional view of a variant of an H-shaped push-on seal;

FIG. 4b a cross-sectional view of a seal having an enlarged bearing surface; and FIG. 4c a cross-sectional view of a seal that is a variant of FIG. 5b.

DETAILED DESCRIPTION

Example embodiments will now be described more fully with reference to the accompanying drawings.

FIG. 1a shows a cross-sectional view of a first embodiment of a frame profile that can be used as a vertical frame profile of a rack for a modular switchgear cabinet unit. The frame profile, which is embodied as a hollow profile, has two hollow chambers 116, 117 situated opposite one another and connected to one another by a connecting bridge 113. Hollow chambers 116, 117 are substantially square and between them form a dovetail groove 118 that borders connecting bridge 113 and is symmetrical with respect to cross-sectional diagonal D. Walls 111 and 112 of hollow chambers 116 and 117, respectively, each form an outer side of the rack. From each of these profile sides 111, 112, profile projections 114, 115 project, extending outward from the respective profile sides 111, 112, specifically at right angles to these sides. The profile projections 114, 115 extend at an angle of approximately 135° in relation to connecting bridge 113.

FIG. 1b shows two frame profiles 100, 100' of FIG. 1a that have been strung together. Frame profile 100' is rotated 90° in relation to frame profile 100, so that the two profiles are facing one another in a mirror-symmetrical arrangement in which profile projection 115 of frame profile 100 is situated facing profile projection 114' of frame profile 118. A push-on seal 130, which is H-shaped in cross-section, has been placed on profile projections 115, 114'. In this case, the length of the legs of H-shaped seal 130 in the cross-sectional direction of frame profiles 100, 100' corresponds substantially to the length of profile projections 115, 114'.

FIG. 2a shows a cross-sectional view of a frame profile 200 which may be understood as a variant of the profile of FIG. 1a. Once again, the profile comprises a hollow profile having two hollow chambers 216, 217, connected to one another via a connecting bridge 213. Hollow chambers 216, 217 are substantially rectangular, and their edges abut one another opposite connecting bridge 213, forming a third hollow chamber 218. Once again, two of walls 211 and 212 of hollow chambers 216, 217 form the outer sides of the rack, with profile projections 214, 215 extending outward from these sides. As with the embodiment of FIG. 1a, profile projections 214, 215 extend at right angles in relation to profile sides 211, 212 and at an angle of 135° in relation to connecting bridge 13, resulting in a configuration that is mirror-symmetrical overall with respect to cross-sectional diagonal D.

FIG. 2b shows the corresponding profiles strung together, in which profile projection 215 of frame profile 200 is situated opposite profile projection 214', forming a gap, and this gap is once again bridged or closed by a push-on seal 230 which is H-shaped in cross-section. Here again, the length of the legs of H-shaped seal 230 in the cross-sectional direction of frame profiles 200, 200' corresponds substantially to the length of profile projections 215, 214'. The stability of the assembly is increased by modular connector 240, which is represented only schematically in FIG. 2b. Modular connectors are known and comprise, for example, a bolt-nut assembly.

FIG. 3a shows a cross-sectional view of a third embodiment of a frame profile according to the principles of the present disclosure. Frame profile 300 is likewise a hollow profile, but with only one hollow chamber 316. Profile sides 311, 312, which form the outer sides of the rack, comprise two profile side segments 311a, 311b and 312a, 312b, which merge into one another and are angled such that first profile side segment 311a of first profile side 311 extends perpendicular to first profile side segment 312a of second profile side 312, and second profile side segment 311b of first profile side 311 extends parallel to second profile side segment 312b of second profile side 312. Once again, on profile sides 311, 312 profile projections 314, 315 are formed, which extend outward from profile sides 311, 312 and are interconnected via a connecting bridge 313. Below this connecting bridge 313 they extend at an angle of approximately 135°, and they extend at the same angle in relation to second profile segments 311*b* and 312*b* of profiles sides 311, 312, respectively. Once again, frame profile 300 is symmetrical with respect to cross-sectional diagonal D. The cross-section of hollow chamber 316 thus corresponds to two partially superimposed squares, in which the length of connecting bridge 313 defines the side length of the smaller square, which is rotated 45° in relation to a square having a greater side length.

FIG. 3*b* shows two corresponding frame profiles 300, 300' strung together, in which profile projections 315 and 314' are opposite one another, forming a gap, which is bridged or closed by a push-on seal 330. Once again, push-on seal 330 is H-shaped in cross-section, however in this case the opposing legs of the H-profile, which enclose profile projections 315 and 314', are configured differently. In particular, the side of seal 330 that faces the interior of the cabinet is embodied as thicker than the side that faces outward, and its edges are rounded. Toward the outside, between frame profiles 300, 300', a modular connector 340 is provided, in this case in the form of a molding or a profiled strip having a C-shaped cross-section.

FIG. 4*a* shows a cross-sectional view of a push-on seal 510 that is substantially H-shaped in cross-section. Between two opposing legs 512, 514, a gap 516 is formed with an approximately rectangular cross-section, the dimensions of which are designed to receive a profile projection of a frame profile in a nearly precise fit. Legs 512, 514 are connected to one another by a bridge 518, which also acts as the depth limit for gap 516. Opposite the first pair of legs 512, 514 is a second pair of legs 520, 522, which are likewise connected to one another by bridge 518 and form a gap 524 between themselves. Unlike gap 516, the cross-section of gap 524 is not rectangular, but widens, proceeding from bridge 518, in an outward direction, so that a tapered groove for receiving the frame profile to be attached or the profile projection thereof is formed. Since the dimensions of gap 524 at or near bridge 518 are still adapted to the thickness of the profile projection of the rack to be attached, a dust-tight and moisture-tight fit is also ensured in this case.

FIG. 4*b* shows a further embodiment of a push-on seal 530, in which between two opposing legs 532 and 534 a gap 536 is formed, the width of which may be smaller than the thickness of the profile projection onto which push-on seal 530 will be pushed. A suitable material selection enables legs 532, 534 to securely encompass the profile projection due to the intrinsic tension of the material. The bridge that connects legs 532, 534 extends from a bead 540 to a bead 542, forming a bearing surface 531. The width of the bearing surface is greater than the width of push-on seal 530 in the region of opposing legs 532, 534. This measure ensures that any tolerances that arise during the stringing together of modular frame profiles can be compensated for, while at the same time enabling a push-on seal 530 of this design to be attached to a different type of profile. For example, the profile projection of a profile according to FIG. 3*a* may be inserted between legs 532, 534, while the profile projection of a frame profile according to FIG. 1*a*, for example, may be attached to bearing surface 538. The options for modular connection are not limited to the frame profile configurations described in this application.

FIG. 4*c* shows a cross-sectional view of another push-on seal 550, which is a variant of push-on seal 530 of FIG. 4*b*. In this case, one of opposing legs 552, 554, namely 554, is shortened, but is still long enough to ensure the formation of a gap 556 between legs 552, 554. Once again, enlarged bearing surface 558 is provided, extending between beads 560, 562 of the bridge that connects legs 552, 554. This embodiment has the added enhancement over the embodiment of FIG. 4 that applying push-on seal 550 to a profile projection of a frame profile is facilitated by the different configuration of legs 552, 554, since in this case the seal does not have to be pushed on, and is instead applied by a tilting movement of push-on seal 550.

The disclosure as a whole provides a switchgear cabinet system in which the seal can be applied between two modular switchgear cabinet units without the use of tools.

The features of the disclosure disclosed in the foregoing description, in the drawings and in the claims are considered essential both individually and in any combination to the implementation of the disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switchgear cabinet system comprising:
 a plurality of switchgear cabinet units strung together in a row, each switchgear cabinet unit comprising a rack which is made up of vertical frame profiles, wherein each of the vertical frame profiles is mirror symmetrical with respect to a cross-sectional diagonal and has profile sides that form the outer sides of the rack and two hollow chambers which are connected by a connecting bridge and projecting outward from the profile sides are profile projections, each extending outward from one of the profile sides;
 wherein the profile sides comprise two profile side segments that merge into one another and are angled such that a first profile side segment of a first profile side extends perpendicular to a first profile side segment of a second profile side, and a second profile side segment of the first profile side extends parallel to a second profile side segment of the second profile side;
 wherein when two racks are strung together, corresponding profile projections of two vertical frame profiles are situated mirror symmetrically opposite one another in each case, leaving a gap between the end faces of the profile projections, which is closed by a seal, said seal being a push-on seal which is seated on at least one of the opposing profile projections and which has at least two legs located opposite one another, between which a gap is formed, the width of which is less than or equal to the width of the profile projection of a selected vertical frame profile,
 and wherein a bridge that connects the opposing legs of the push-on seal has a curved concave bearing surface which is wider than the thickness of the profile projection of the vertical frame profile to be attached there, and the opposing legs of the push-on seal have different lengths or widths.

2. The switchgear cabinet system according to claim 1, wherein each of the profile projections extends perpendicularly from a respective profile side.

3. The switchgear cabinet system according to claim 1, wherein each of the profile projections extends at an angle of substantially 135° in relation to the bridge.

4. The switchgear cabinet system according to claim 1, wherein between the two hollow chambers, bordering the connecting bridge, a dovetail groove is formed, which is symmetrical with respect to the cross-sectional diagonal.

5. The switchgear cabinet system according to claim 1, wherein between the two hollow chambers, bordering the connecting bridge, a third hollow chamber is formed.

6. The switchgear cabinet system according to claim 2, wherein each of the profile projections extends at an angle of substantially 135° in relation to a bridge between the profile projections.

7. The switchgear cabinet system according to claim 1, wherein each of the vertical frame profiles comprises two profile projections that extend perpendicularly to each other.

8. The switchgear cabinet system according to claim 1 wherein at least one of the profile projections is formed by a portion that is folded back onto itself.

9. A switchgear cabinet system comprising:
a plurality of switchgear cabinet units strung together in a row, each switchgear cabinet unit comprising a rack which is made up of vertical frame profiles, wherein each of the vertical frame profiles is mirror symmetrical with respect to a cross-sectional diagonal and has profile sides that form the outer sides of the rack and two hollow chambers which are connected by a connecting bridge and projecting outward from the profile sides are profile projections, each extending outward from one of the profile sides;
wherein the profile sides comprise two profile side segments that merge into one another and are angled such that a first profile side segment of a first profile side extends perpendicular to a first profile side segment of a second profile side, and a second profile side segment of the first profile side extends parallel to a second profile side segment of the second profile side;
wherein when two racks are strung together, corresponding profile projections of two vertical frame profiles are situated mirror symmetrically opposite one another in each case, leaving a gap between the end faces of the profile projections, which is closed by a seal, said seal being a push-on seal which is seated on at least one of the opposing profile projections and which has at least two legs located opposite one another, between which a gap is formed, the width of which is less than or equal to the width of the profile projection of a selected vertical frame profile; and
wherein the push-on seal is substantially H-shaped in cross-section, and between the opposing legs of the push-on seal a gap is formed, which widens starting from a bridge that connects the legs.

10. The cabinet system of claim 9 further comprising:
a connecting bridge connecting the two profile projections, the profile projections extending at an angle of substantially 135° in relation to the bridge.

11. The switchgear cabinet system according to claim 9, wherein each of the profile projections extends perpendicularly from a respective profile side.

12. The switchgear cabinet system according to claim 9, wherein between the two hollow chambers, bordering the connecting bridge, a dovetail groove is formed, which is symmetrical with respect to the cross-sectional diagonal.

13. The switchgear cabinet system according to claim 9, wherein between the two hollow chambers, bordering the connecting bridge, a third hollow chamber is formed.

14. The switchgear cabinet system according to claim 9 wherein the frame profile comprises two profile projections that extend perpendicularly to each other.

15. The switchgear cabinet system according to claim 9 wherein at least one of the profile projections is formed by a portion that is folded back onto itself.

* * * * *